(12) United States Patent
Neff et al.

(10) Patent No.: US 6,467,425 B1
(45) Date of Patent: Oct. 22, 2002

(54) APPARATUS FOR INTERNALLY COATING A METAL TUBE

(75) Inventors: Helmut Neff, Hermannsburg; Thomas Weise; Alexei Voronov, both of Unterlüss; Gert Schlenkert, Düsseldorf, all of (DE)

(73) Assignee: Rheinmetall Industrie AG, Unterluss (DE)

( * ) Notice: Subject to any disclaimer, the term of this patent is extended or adjusted under 35 U.S.C. 154(b) by 129 days.

(21) Appl. No.: 09/660,405

(22) Filed: Sep. 12, 2000

Related U.S. Application Data

(62) Division of application No. 09/137,079, filed on Aug. 20, 1998, now Pat. No. 6,183,820.

(30) Foreign Application Priority Data

Aug. 20, 1997 (DE) .......................................... 197 36 028

(51) Int. Cl.$^7$ .............................................. C23C 16/00
(52) U.S. Cl. ................... 118/723 VE; 118/726
(58) Field of Search ........................ 118/723 VE, 723 E, 118/726, 723 EB, 723 MP, 723 HC; 204/298.02, 298.05, 298.06, 298.12, 298.13, 298.14, 298.15

(56) References Cited

U.S. PATENT DOCUMENTS 4,354,456 A    10/1982    Campbell et al.

FOREIGN PATENT DOCUMENTS

| DE | 34 35 320 | 4/1986 |
| GB | 1 482 219 | 8/1977 |
| GB | 2 158 103 | 11/1985 |
| JP | 2-282477 | * 11/1990 |

* cited by examiner

*Primary Examiner*—Gregory Mills
*Assistant Examiner*—Luz Alejandro
(74) *Attorney, Agent, or Firm*—Venable; Norman N. Kunitz

(57) ABSTRACT

An apparatus for coating the inside of a metal tube with an electrically conducting material, including first and second electrode assemblies supported within the tube. The axially spaced electrode assemblies each include a main electrode. The main electrode of the first electrode assembly is supported on the inner tube face via an insulating member. The second electrode assembly has an auxiliary electrode connected to the main electrode of the second electrode assembly and to the tube. A wire is secured to and extending between the main electrodes. A current source is connected to the main electrode of the first electrode assembly and the main electrode of the second electrode assembly through the tube and the auxiliary electrode for passing an electric current pulse through the wire for causing an explosive vaporization thereof, whereby particles of the vaporized material form a layer on the inner tube face.

1 Claim, 1 Drawing Sheet

APPARATUS FOR INTERNALLY COATING A METAL TUBE

CROSS REFERENCE TO RELATED APPLICATION

This application is a division of application Ser. No. 09/137,079, filed Aug. 20, 1998, now U.S. Pat. No. 6,183,820, issued Feb. 6, 2001.

BACKGROUND OF THE INVENTION

The invention relates to a method and an apparatus for internally coating a metal tube, particularly a weapon barrel, with an electrically conducting layer.

In weaponry, efficiency-augmented ammunition causes, because of the high gas temperatures and flow velocities generated during firing, particularly in steel weapon barrels, significant erosions which wear out the barrel even before service-terminating metal fatigue sets in. It has been known to provide the inner face of weapon barrels with a hard chromium layer to prevent such erosions. Conventionally, the hard chromium is electrolytically deposited on the inner surface of the weapon barrel.

It is a disadvantage of the above-outlined conventional method that, among others, the electrolytically deposited hard chromium layers are very brittle and are not capable of withstanding the stresses caused by efficiency-augmented ammunition. Thus, significant erosion phenomena appear at barrel areas which consequently lose the chromium coating.

SUMMARY OF THE INVENTION

It is an object of the invention to provide an improved method and apparatus of the above-outlined type with which particularly metals of high melting point may be applied in a simple manner to the inner face of a metal tube and wherein the coating applied to the metal tube has a high degree of bonding strength.

These objects and others to become apparent as the specification progresses, are accomplished by the invention, according to which, briefly stated, the method of coating an inner face of a metal tube with an electrically conducting coating material includes the steps of positioning a wire, made of the coating material, generally axially in an interior of the tube, along the inner face thereof; and passing an electric current pulse of sufficient intensity through the wire to cause an explosive vaporization thereof, whereby particles of the vaporized material impinge on the inner face of the metal tube and form a layer thereon.

It is thus the essence of the invention to provide an inner coating on a tube by a "coating from the vapor phase" in which the vaporization of the coating material is effected by a "wire explosion".

For performing the method, first the coating substance is, as a wire, arranged generally axially in the tube or tube section to be coated. Thereafter, an electric current pulse is passed through the wire, wile selecting the current intensity such that the wire vaporizes in a burst. The particles obtained by vaporizing the substance impinge with a high kinetic energy on the inner surface of the tube causing a local melting of the particles on the tube wall and a formation of an alloy between the tube material to be coated and the coating substance. In this manner, a high degree of bonding strength between tube and coating is obtained.

It is an advantage of the method according to the invention that it may be used for a great number of diverse coating substances. Further, the coating applied with the method according to the invention has a lesser porosity as compared to methods applied by means of thermal spraying.

To ensure that the particle speed of the particles upon vaporization of the coating substance is not braked by air molecules, it is advantageous to perform the coating operation in a vacuumized inner space of the tube. Such a method has further the advantage that both cluster formations and oxidation on the inner tube surface are avoided.

According to another embodiment of the invention, it has been found expedient not to evacuate the inner space of the tube but to introduce a working gas thereinto. In this manner, the hardness of the coating is further increased. It has been found to be particularly advantageous to use methane as a working gas in conjunction with carbide-forming coating substances.

DESCRIPTION OF THE PREFERRED EMBODIMENTS

Figure 1:
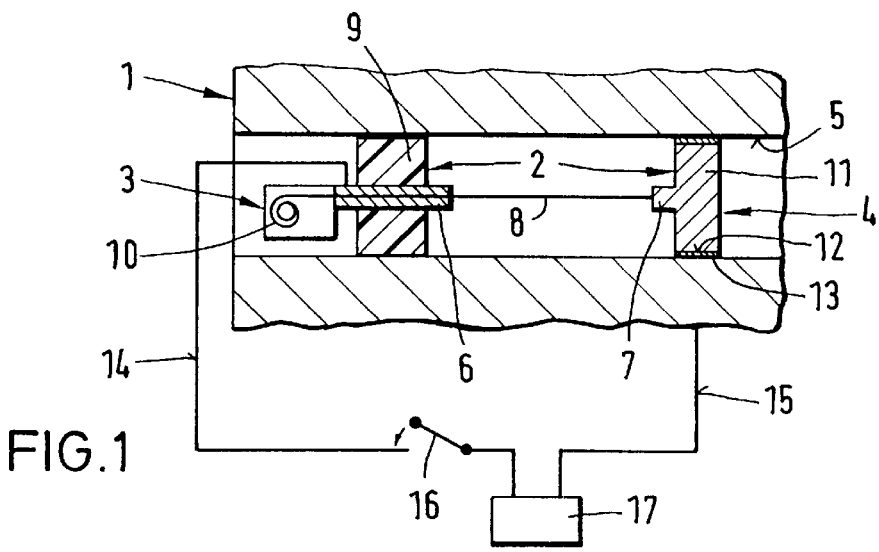
FIG. 1 is an axial sectional view of a weapon barrel and an apparatus according to the invention, depicted prior to vaporization by wire explosion.
Figure 2:
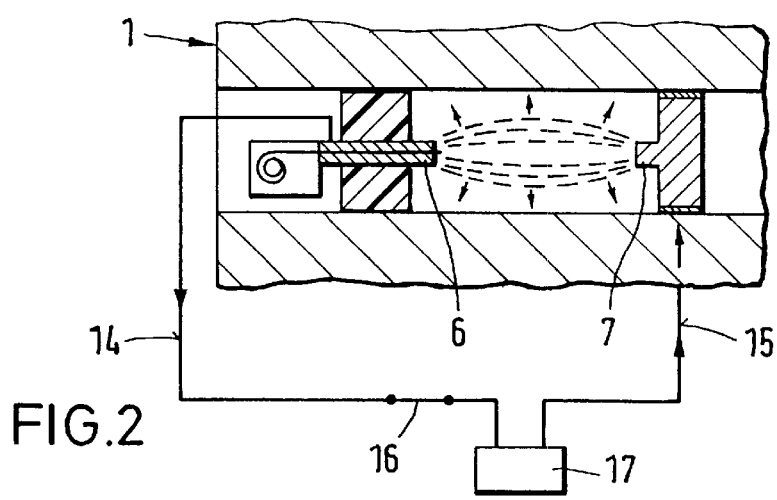
FIG. 2 is a view similar to FIG. 1, depicting the moment of vaporization of the wire forming the coating substance.
Figure 3:
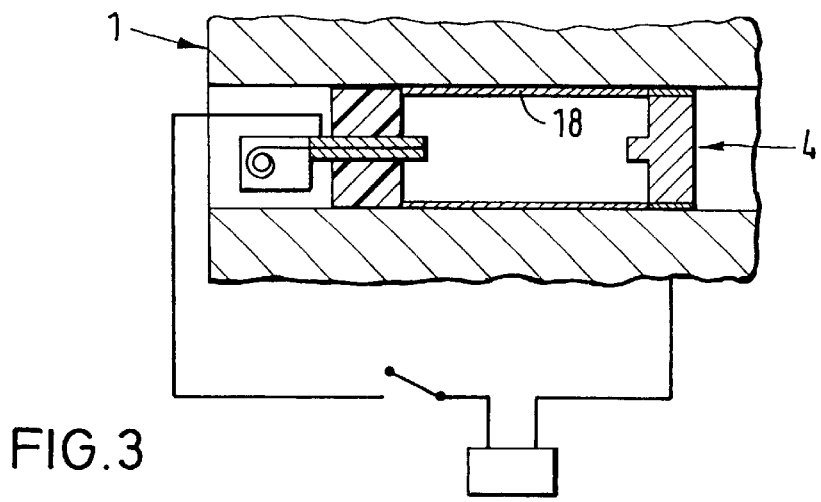
FIG. 3 is a view similar to FIG. 1, showing the weapon tube subsequent to the coating operation.

FIGS. 1, 2 and 3 show a weapon barrel 1 of a large-caliber weapon. An apparatus 2 according to the invention is arranged in the barrel 1. The apparatus 2 includes essentially two electrode assemblies 3 and 4 which are supported on the inner surface 5 of the barrel 1 and each of which has at least one respective main electrode 6 and 7 to which, as shown in FIG. 1, the wire 8 to be vaporized is secured so that it extends between the electrodes 6, 7.

In the electrode assembly 3 the main electrode 6 is surrounded in a partial zone by an insulating body 9 which is, about its periphery, supported on the inner surface 5 of the barrel 1. Further, the wire 8 to be vaporized is passed through the electrode 6 and wound on a spool 10 so that upon moving the electrode assemblies 3 and 4 away from one another in the barrel 1, partial zones of diverse length or, if desired, the barrel 1 along its entire length may be coated.

The electrode assembly 4 essentially includes a metal body 11 which encompasses the main electrode 7 and carries about its outer periphery 12 auxiliary electrodes 13, whereby the main electrode 7 is electrically conductively connected with the weapon barrel 1 made, for example, of steel.

The electrodes 6 and 7 are connected with an only schematically illustrated capacitor battery 17 by conductors 14 and 15 and a switch 16. In the described example, the conductor 14 is directly connected to the electrode 6, while the conductor 15 is directly connected to the barrel 1 (which, in turn is electrically connected to the electrode 7 via the auxiliary electrodes 13).

Upon closing the switch 16, the energy stored in the capacitors of the battery 17 is discharged, and the wire 8 tensioned between the electrode assemblies 3 and 4 is, by means of the generated current pulse, evaporated in an explosive manner as illustrated in FIG. 2. The particles generated during the evaporation process attain a high escaping velocity and accordingly impinge on the inner barrel face 5 with a high kinetic energy which is, to a great extent, converted to heat upon impact. As a result, as shown in FIG. 3, on the inner surface 5 of the barrel 1 a layer 18 builds up which, under the formation of an alloy between the tube material and the layer material, is fused with the barrel and thus has a high bonding strength.

As a rule, several wire explosions may have to be performed to provide the weapon barrel with a sufficiently thick layer. It is further feasible to perform the described coating operation consecutively, along length portions of the tube.

Because of their high melting points, preferably refractory metals, such as niobium, tantalum, molybdenum, tungsten, hafnium, etc. and its alloys are adapted as coating substances. These metals cannot be galvanically deposited from water-containing electrolytes.

It is to be understood that the invention is not limited to the described example. Thus, for example, the weapon barrel 1 may be vacuumized prior to the wire explosion; for this purpose, the barrel is plugged airtight on both sides of the section to be vapor-deposited. It is also possible to provide electrode assemblies of a structure other than that shown in the figures, thus, for example, the second electrode assembly too, may be supported by an insulating body on the inner barrel wall and may be connected directly with the capacitor battery by means of an electric conductor.

It will be understood that the above description of the present invention is susceptible to various modifications, changes and adaptations, and the same are intended to be comprehended within the meaning and range of equivalents of the appended claims.

What is claimed is:
1. A combination of a metal tube with an apparatus for coating an inner face of said metal tube with an electrically conducting material, comprising:
(a) first and second electrode assemblies supported in an interior of said metal tube; said first and second electrode assemblies being axially spaced from one another and each including a main electrode; at least said first electrode assembly including an insulating member; the main electrode of said first electrode assembly being supported on said inner face with an interposition of said insulating member; said second electrode assembly including an auxiliary electrode connected to said main electrode of said second electrode assembly and to said metal tube;
(b) a wire, made of said material, secured to and extending between said main electrodes; and
(c) a source of high-intensity current connected to said main electrode of said first electrode assembly, and to said main electrode of said second electrode assembly through said metal tube and said auxiliary electrode of said second electrode assembly, for passing an electric current pulse through said wire for causing an explosive vaporization thereof to produce a vaporized material from said wire, whereby particles of the vaporized material impinge on said inner face and form a layer thereon.

* * * * *